ION IMPLANTED SEMICONDUCTOR STRUCTURES

Filed Oct. 6, 1971 2 Sheets-Sheet 1

INVENTORS
KARL BRACK
EDWARD F. GOREY
GUENTER H. SCHWUTTKE

BY [signature]
ATTORNEY

ION IMPLANTED SEMICONDUCTOR STRUCTURES

Filed Oct. 6, 1971 2 Sheets-Sheet 2

United States Patent Office 3,726,719
Patented Apr. 10, 1973

3,726,719

ION IMPLANTED SEMICONDUCTOR STRUCTURES

Karl Brack, Fishkill, Edward F. Gorey, Beacon, and Guenter H. Schwuttke, Poughkeepsie, N.Y., assignors to International Business Machines Corporation, Armonk, N.Y.

Filed Oct. 6, 1971, Ser. No. 186,890
Int. Cl. H01l 7/54, 19/00
U.S. Cl. 148—1.5 6 Claims

ABSTRACT OF THE DISCLOSURE

Disclosed is a method for implanting silicon ions into monocrystalline silicon semiconductor substrates and forming amorphous insulating layers and boundaries within said substrate thereby forming isolation structures, devices and other discrete or interconnected semiconductor components. This is accomplished by bombarding the silicon body with controlled and directed silicon ions with an energy level sufficient to result in ion penetration to the desired subsurface depth.

BACKGROUND OF INVENTION

Field of invention

The invention relates to semiconductor structures manufactured by ion implanting silicon ions into the subsurface of a monocrystalline silicon semiconductor substrate and more particularly to isolation procedures for insulating portions of the monocrystalline semiconductor body and the formation of ion implanted structures within said monocrystalline substrate. The invention herein described was made in the course of a contract with Department of Air Force.

Description of prior art

Our co-pending patent application entitled "Semiconductor Isolation Structure and Method of Producing," Ser. No. 821,908, filed May 5, 1969 and assigned to the same assignee as the assignee of the present application, discloses a method for producing an insulating layer in the monocrystalline semiconductor body by bombarding the body with dissimilar ions such as nitrogen, oxygen, and carbon for a time sufficient to produce a dense layer of embedded ions at an energy level sufficient to result in ion penetration to the desired subsurface depth. The body is subsequently heated to a temperature sufficient to react embedded ions with the ions of the semiconductor body to produce an insulating layer.

Similarly, our co-pending patent application entitled "Monocrystalline Semiconductor Body Having Dielectrically Isolated Regions and Method of Forming," Ser. No. 883, filed Jan. 6, 1970, which is a continuation-in-part of our aforesaid co-pending application, discloses a monocrystalline semiconductor body having a single continuous insulating layer extending from the surface to a selected depth in the body and surrounding a region of the body to dielectrically isolate the region which has one surface formed by the surface of the body from the remainder of the body. This insulating layer is produced by bombarding the body with ions which react with atoms in the body when heated to a predetermined temperature. The ions are directed to an opening in a mask and a bevelled surface of the mask surrounding the opening. The bevel surface controls the penetration of the ions from the surface of the body into the body to the subsurface layer of the ions directed through the opening of the mask. When the body is heated to the selected temperature, the embedded ions react with the atoms in the body to produce the insulating layer and dielectrically isolate the region surrounded by the single continuous layer from the remainder of the body.

In the fabrication of monolithic integrated circuits the number of active elements such as transistors and diodes, for example, and a number of passive elements such as resistor and capacitors are formed in or on the same monocrystalline semiconductor body. These active and passive elements are interconnected into a circuit by a pattern of metallization on an insulating film covering the surface of the semiconductor body. The undesirable electrical interaction of the elements with each other is prevented by internally isolating the active and passive elements of the device from each other.

Various structures and techniques have been proposed to provide such isolation. PN junctions have been fabricated into the semiconductor body between the active and passive elements. This is commonly referred to as a "junction isolation." There are a number of disadvantages with this type of isolation since the existence of PN junction and the fields created thereby introduces parasitic capacitance which is normally undesirable particularly in high speed semiconductor devices. Another disadvantage which is particularly important in devices used by the military and also in devices used in outer-space is that the junctions are radiation sensitive. The exposure to significant amounts of radiation alters or breaks down the isolating junctions thereby potentially destroying the operability of such devices. Another method of insulating the various devices in the monolithic integrated circuit is to surround each device with a layer of insulating material. This is commonly referred to as a "dielectric isolation." Various methods are available for surrounding the device, as for example, etching channels in a semiconductor wafer separating the various regions of the device; forming an isolating layer over the top surface of the device and subsequently inverting the device and removing the balance of the wafer down to the bottom of the channels. This leaves segments of the wafer exposed which are surrounded by the isolation material which also serves as a backing structure. Such fabrication techniques, however, are time consuming, tedious and very exacting and often costly and protracted.

Heretofore, where insulating layers were formed such as silicon nitride, silicon carbide, and silicon oxide the implanted ions were other than ions making up the atomic structure of the monocrystalline semiconductor body. If a silicon nitride layer was desired, nitrogen atoms were implanted as the first step in the formation of an insulating silicon nitride compound within the semiconductor body. Generally after bombardment of this nature the body is heated to a temperature in the neighborhood of 1,100° C. for a time sufficient to react the implanted ions with the ions within the body. This procedure allows the insulating compound to be formed within the monocrystalline body.

SUMMARY OF INVENTION

An object of this invention is to provide a method for forming a dielectrically isolated region in a monocrystalline semiconductor body.

Another object of this invention is to provide a semiconductor device having a monocrystalline semiconductor body with at least one dielectrically isolated region therein and wherein discrete or integrated devices can be formed by conventional methods or by further ion implantation.

Still another object of this invention is to provide at least one dielectrically isolated region in a monocrystalline semiconductor body utilizing ion implantation techniques.

Still another object of this invention is to produce a semiconductor device having a monocrystalline semiconductor body with at least one dielectrically isolated region therein and formed by ion implantation utilizing a uniform energy level.

In accordance with the aforementioned objects, the method of this invention involves bombarding a silicon monocrystalline semiconductor body with silicon ions and maintaining the bombardment for a time sufficient to produce a dense amorphous layer resulting from the implantation of ions at an energy level sufficient to obtain the desired subsurface depth of ion penetration.

The device of the invention is a monocrystalline semiconductor body having a monocrystalline dielectrically isolated region or regions.

BRIEF DESCRIPTION OF THE DRAWING

The foregoing and other objects, features, and advantages of the invention will be apparent from the following more particular description of the preferred embodiments of the invention as illustrated in the accompanying drawing wherein.

DESCRIPTION OF PREFERRED EMBODIMENTS

Figure 1:
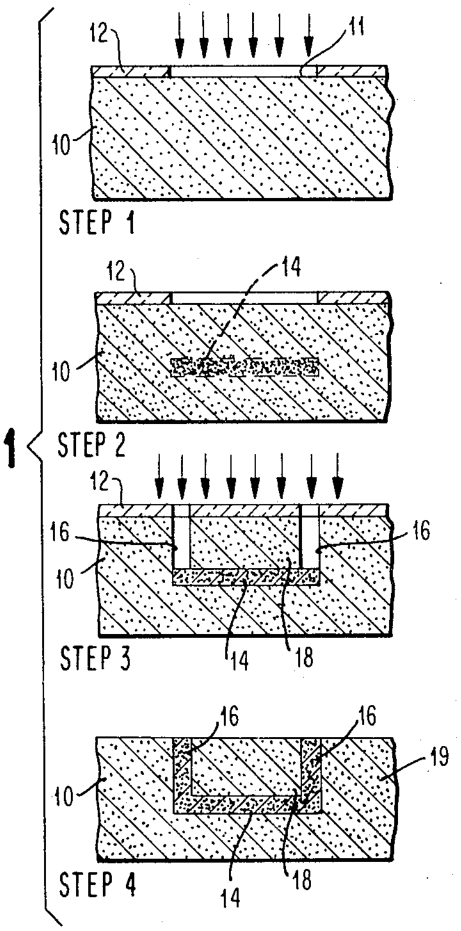
FIG. 1 is a flow diagram illustrating the process of the invention for forming a sub-surface dielectrically isolated monocrystalline body.
Figure 2:
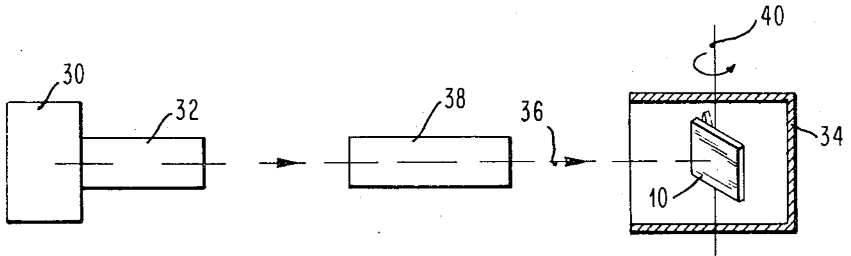
FIG. 2 is a diagrammatic view of an apparatus for ion implantation suitable for use in carrying out the process of this invention.

In the process of forming a buried layer in a monocrystalline body, ions are implanted into the body in a well defined region as generally indicated in FIG. 1. This invention is particularly directed to implanting silicon ions in a monocrystalline silicon substrate. The apparatus for achieving the implanting of the ions is shown diagrammatically in FIG. 2. This apparatus or comparable equipment alows an atom of some element to be ionized at the ion source 30 and accelerated by a potential gradient through accelerator 32 to an energy high enough to be implanted in target 10 in target chamber 34. Since the beam 36 of the particles is charged, it is affected by magnets and electric fields and thus may be focused and deflected in chamber 38 or by a mass with separate magnets.

The depth to which the ions of beam 36 are implanted in target 10 is a function of the ion beam energy and the angle of incidence of the beam with respect to the target 10. The angle of incidence may be controlled, for instance, by rotating target 10 about an axis 40. Generally an ion beam with an energy of from 5 kev. to 3 mev. is sufficient for implanting ions in a monocrystalline substrate 10. A number of methods are available for controlling the area of implantation. Due to the ion being affected by magnetic and electrical fields it may be focused and deflected electrostatically in such a manner as to trace out or describe the area to be implanted. A second method would be to provide a mask somewhere along the path of beam 36 which would selectively blockout portions, thus providing areas of implantation on the target 10.

A third method for controlling the areas of implantation is through the use of masking the substrate's surface with a suitable masking material. Any material can be used to mask areas of the wafer 10 which are not to be implanted. Normally the masking films are deposited and shaped to expose desired areas of the body by utilizing conventional photolithographic techniques.

In carrying out the method of the invention a monocrystalline semiconductor body preferably silicon is bombarded with silicon atoms as shown in step 1 of FIG. 1. The bombardment can be done along any direction relative to the axis of the crystal, however, it is preferable that the bombardment be done at an angle which is 2° off one of the major central axis. The angle of the crystal lattice relative to the direction of the bombardment will influence the depth of penetration by inclining the axi sof the crystal a small degree relative to the direction of the bombardment. A more close packing of the implanted ions within the body is believed to result. The area of bombardment can be controlled by any of the aforementioned methods. As shown in FIG. 1 the surface 11 of body 10 is masked with a masking layer 12. The masking layer prevents ions from penetrating into the body 10 in the mask area. The maskiing layer 12 can be any suitable metal or insulation material. Typical materials include molybdenum, tungsten, platinum, gold, silver, silicon dioxide, silicon nitride and the like. Normally the masking layer will necessarily be only a few thousand angstroms in thickness and can be shaped by conventional photolithographic techniques.

Figure 3:
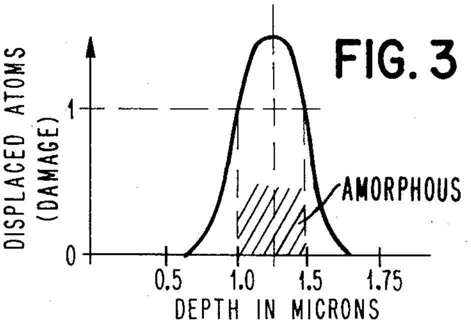
FIG. 3 is the known arbitrary qualitative plot of displaced atoms or damage in a silicon crystal lattice structure due to silicon ion implantation versus depth corresponding to a silicon ion dose of $6\times10^{15}$ ions per cm.$^2$.

As shown in step 2, a region or layer 14 is formed within the semiconductor body 10 under the unprotected or unmasked areas of the body 10. Within region 14 there is a high concentration of implanted silicon ions while the area above the implanted 14 region remains as undamaged monocrystalline structure. The depth of region 14 within the body will depend upon the energy of bombardment. In general energies of 500 kev. to 3 mev. are utilized depending on the depth of penetration desired. FIG. 3 illustrates the cross-sectional damage profile of the resultant device pictured in step 2 of FIG. 1. The concentration of implanted ions in region 14 is $10^{18}$ to $10^{22}$ ions per cc. As indicated in step 2 the ions are implanted in the body 10 and form an amorphous silicon layer 14. The amorphous silicon layer has a resistivity in excess of 1000 ohm cms. and the resistivity is unaffected by annealing at 550° C. for one hour.

The body 10 provided with the buried insulating layer 14 can thereafter be processed to form an insulation structure as indicated in steps 3 and 4 of FIG. 1. The layer 14 provides an effective insulating base layer for the bottom surface of an isolation structure or device. The size of an active or passive device in an integrated circuit can be insulated in accordance with this invention by any suitable technique, as for example, providing the masking layer 12 illustrated in step 3 of FIG. 1. The insulating boundaries 16 are formed as the ion bombardment is continued without any change in implanting energy. The energy level is maintained at the same magnitude throughout the process; therefore avoiding any apparatus alignment or adjustment. The implanted boundaries 16 are amorphous silicon having the resistivity in excess of 1000 cms. and is unaffected by a one hour 550° C. heat treatment. The dielectrically isolated area 18 is adaptable to the formation of discrete or integrated devices in accordance with well known techniques such as diffusion procedures as well as further ion implantation steps. Although the illustration depicts formation of a single isolation stress well known masking techniques will provide the formation of multiple structures simultaneously.

A typical isolation region is illustrated by step 4 of FIG. 1 where the base member 14 and the sidewall members 16 are amorphous dielectric insulating boundaries around the monocrystalline region 18 and forming a division between the respective monocrystalline areas 18 and 19. In order to form an effective continuous insulating layer, the concentration of implanted silicon ions in general must be $10^{15}$ or greater and preferably $10^{20}$ to $10^{22}$ ions per cc.$^2$.

EXAMPLE I

Figure 6:
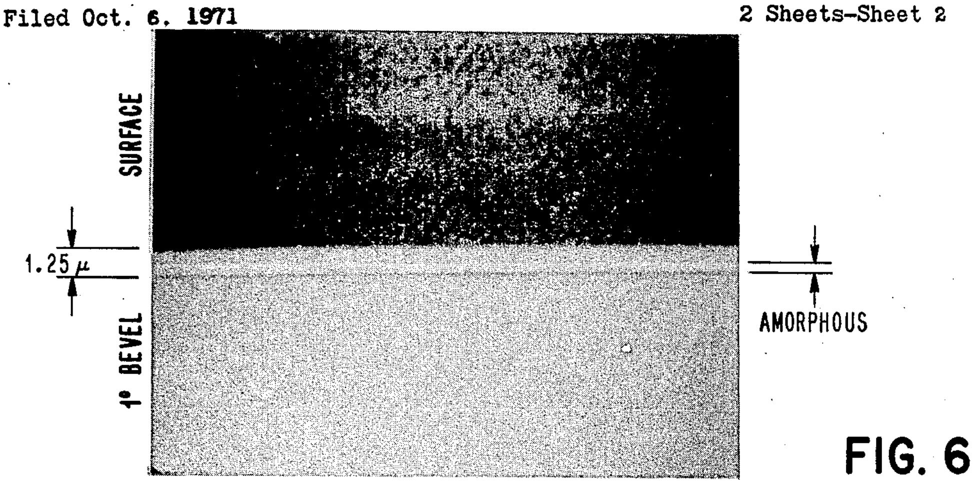
FIG. 6 is an optical photomicrograph showing subsurface silicon amorphous layer at a position as illustrated by the profile of FIG. 3.

A P type silicon semiconductor wafer having surfaces inclined approximately 2° to the <111> lattice plane orientation and having a resistivity of one ohm centimeter and being of low oxygen content was implanted with $Si^+$ atoms using a total energy of one million electron volts. The current employed was 2.3 micro amperes, ion beam current, and the implanted area was 4 square centimeters at a current density of 0.58 micro amperes per square centimeter, corresponding to a flux of $3.6 \times 10^{12}$ ions per square centimeter second. The bombardment time was 28 minutes for a total dose of $6 \times 10^{15}$ ions per square centimeter. FIG. 3 illustrates the implantation damage profile in accordance with the above conditions and in accordance with generally known conditions and is further manifested by the optical photomicrograph of said wafer in FIG. 6.

EXAMPLE II

Figure 4:
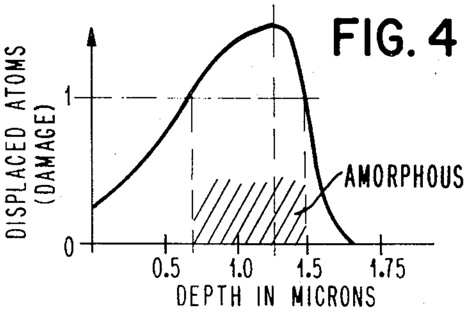
FIG. 4 is the new arbitrary qualificative plot of displaced atoms or damage in a crystal lattice structure due to ion implantation verses depth of implantation corresponding to a silicon ion dose of $1\times10^{16}$ ions per cm.$^2$ and based upon experimental observations.
Figure 7:
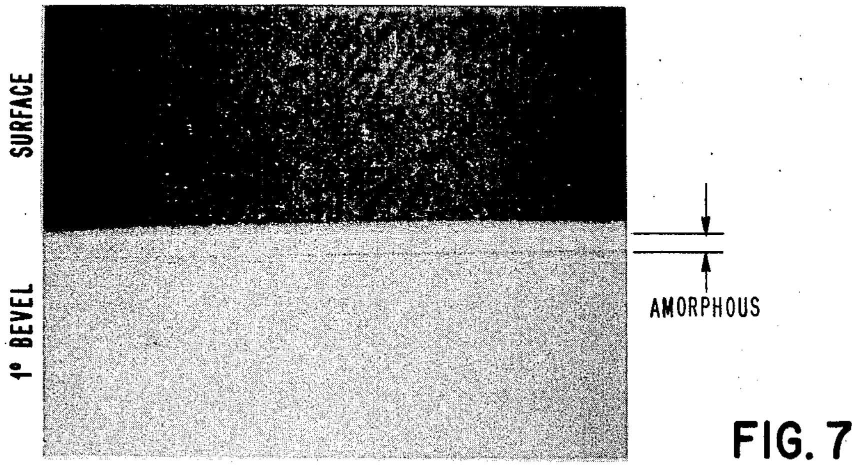
FIG. 7 is an optical photomicrograph showing the sub-surface silicon amorphous layer at a position as shown by the profile of FIG. 4.

Another P type silicon semiconductor wafer was bombarded with $Si^+$ ions in accordance with conditions of Example I and maintaining the same energy level of 1 mev. as illustrated in Example I, for a time of 46 minutes to give a total dose of $1 \times 10^{16}$ ions per square centimeter. FIG. 4 illustrates the continued amorphous growth towards the surface and is further manifested by the optical photomicrograph of said wafer in FIG. 7.

EXAMPLE III

Figure 5:
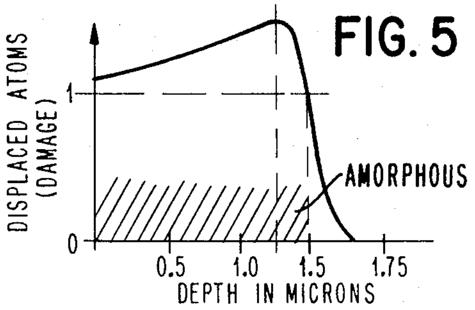
FIG. 5 is the new arbitrary qualificative plot of displaced atoms or damage in a crystal lattice structure due to ion implantation versus depth of implantation corresponding to a silicon ion dose of $6\times10^{16}$ ions per cm.$^2$ and based upon experimental observations.
Figure 8:
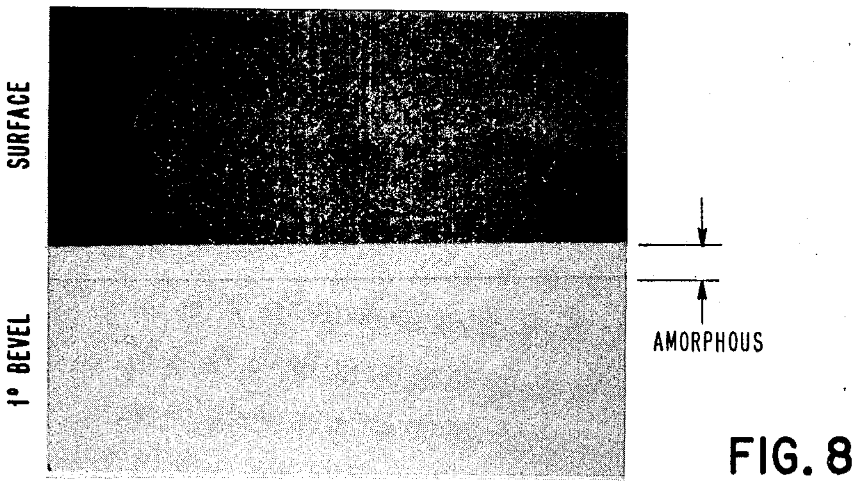
FIG. 8 is an optical photomicrograph showing the sub-surface silicon amorphous layer at the position as shown by the profile of FIG. 5.

Another P type silicon semiconductor wafer was bombarded with $Si^+$ ions in accordance with the conditions of Example I and maintaining the same energy level of 1 mev. as illustrated in Example I, for a time of 280 minutes to give a total dose of $6 \times 10^{16}$ ions per square centimeter. FIG. 5 illustrates the continued amorphous growth to the surface and is further manifested by the optical photomicrograph of said wafer in FIG. 8.

It is apparent from the foregoing that growth of amorphous silicon in a silicon crystalline semiconductor body, in accordance with the invention, is homogeneous and not stratified or segmented in nature resulting from a sequential decrease in energy level to effect a reduced penetration depth in an attempt to produce amorphous subsurface structures and an extention thereof upward to the wafer surface.

A similar result is obtained when germanium ions are implanted or bombarded into a monocrystalline germanium body. The depth of penetration will be different for various energy levels. These penetration levels are well known and readily found in the literature. Similarly the amorphous germanium resistance will withstand a temperature of approximately 400° C. before recrystallization takes place.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for producing an insulating amorphous structure in a monocrystalline body selected from the group consisting of silicon and germanium comprising bombarding said monocrystalline body with ions the same as the monocrystalline body and maintaining the bombardment at an energy level sufficient to result in ion penetration to the desired sub-surface depth.

2. A method in accordance with claim 1 wherein the ion implantation beam energy is greater than 5 kev.

3. A method in accordance with claim 1 wherein the implanted ion dose is $1 \times 10^{15}$ ions per square centimeter or higher.

4. A method for producing an amorphous structure in a monocrystalline body selected from the group consisting of silicon and germanium comprising masking a portion of said monocrystalline body and bombarding said body with ions the same as the monocrystalline body and maintaining the bombardment at an energy level sufficient to result in ion penetration to the desired sub-surface depth.

5. A method in accordance with claim 4 wherein the ion implantation beam energy is greater than 5 kev.

6. A method in accordance with claim 4 wherein the implanted ion dose is $1 \times 10^{15}$ ions per square centimeter or higher.

References Cited

UNITED STATES PATENTS 3,622,382 11/1971 Brack et al. -------- 117—201

OTHER REFERENCES

Brodsky et al.: I.B.M. Tech. Discl. Bull., vol. 12, No. 9, February 1970, pp. 1383 and 1384.

MARTIN H. EDLOW, Primary Examiner

U.S. Cl. X.R.

317—235 AY, 235 E, 235 AT